United States Patent
Ren

(10) Patent No.: US 11,908,875 B2
(45) Date of Patent: Feb. 20, 2024

(54) DISPLAY PANEL AND DISPLAY DEVICE

(71) Applicant: Shenzhen China Star Optoelectronics Semiconductor Display Technology Co., Ltd., Guangdong (CN)

(72) Inventor: Wei Ren, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 820 days.

(21) Appl. No.: 16/963,262

(22) PCT Filed: May 20, 2020

(86) PCT No.: PCT/CN2020/091132
§ 371 (c)(1),
(2) Date: Jul. 20, 2020

(87) PCT Pub. No.: WO2021/217754
PCT Pub. Date: Nov. 4, 2021

(65) Prior Publication Data
US 2023/0116459 A1    Apr. 13, 2023

(30) Foreign Application Priority Data
Apr. 28, 2020  (CN) .......................... 202010351294.8

(51) Int. Cl.
*G02F 1/1339*  (2006.01)
*H01L 27/12*   (2006.01)
*G02F 1/1333*  (2006.01)
*G02F 1/1345*  (2006.01)
*H01L 23/31*   (2006.01)

(52) U.S. Cl.
CPC ........ *H01L 27/1262* (2013.01); *G02F 1/1339* (2013.01); *G02F 1/13394* (2013.01); *G02F 1/13454* (2013.01); *G02F 1/133345* (2013.01); *H01L 27/1288* (2013.01); *H01L 23/3171* (2013.01)

(58) Field of Classification Search
CPC ............. G02F 1/1337; G02F 1/133711; G02F 1/133723; G02F 1/1339; G02F 1/13394; G02F 1/13454; G02F 1/133345
See application file for complete search history.

(56) References Cited

U.S. PATENT DOCUMENTS

| | | | |
|---|---|---|---|
| 2014/0285754 A1* | 9/2014 | Lee .................. | G02F 1/133711 349/123 |
| 2015/0261050 A1* | 9/2015 | Chen ................. | G02F 1/133512 349/42 |

(Continued)

FOREIGN PATENT DOCUMENTS

| | | |
|---|---|---|
| CN | 106526999 | 3/2017 |
| CN | 106601781 | 4/2017 |

(Continued)

*Primary Examiner* — Angela K Davison

(57) ABSTRACT

A display panel and a display device are provided. A retaining wall is disposed on a middle position of a driver circuit layer, the retaining wall can prevent an insulating film from overlapping a whole sealing layer in an insulating film coating process, which improves adhesion of the display panel and reliability against high temperature and high humidity, thereby improving quality of the display panel.

18 Claims, 3 Drawing Sheets

(56) References Cited

U.S. PATENT DOCUMENTS

2017/0269405 A1* 9/2017 Hirota ............... G02F 1/133345
2018/0031903 A1    2/2018 Nagata
2021/0333597 A1* 10/2021 Liao ................... G02F 1/13398

FOREIGN PATENT DOCUMENTS

| CN | 109802053 | 5/2019 |
| CN | 109860422 | 6/2019 |
| CN | 110021642 | 7/2019 |
| CN | 110879493 | 3/2020 |

* cited by examiner

DISPLAY PANEL AND DISPLAY DEVICE

RELATED APPLICATIONS

This application is a National Phase of PCT Patent Application No. PCT/CN2020/091132 having International filing date of May 20, 2020, which claims the benefit of priority of Chinese Patent Application No. 202010351294.8 filed on Apr. 28, 2020. The contents of the above applications are all incorporated by reference as if fully set forth herein in their entirety.

FIELD AND BACKGROUND OF THE INVENTION

The present disclosure relates to the field of display technologies, and more particularly, to a display panel and a display device.

With rapid development of LCD devices, consumers are increasing demand for different quality LCD products in the market. Wherein, a demand for narrow frame, frameless, and splice screen products is increasing, and techniques of narrow frames and extremely narrow frames also face some technical problems.

In current technology, to seal a PI material (polyimide film) in a narrow frame area of a gate driver on array (GOA) driver circuit, a distance between PI and an AA area is reduced, so there is a high demand for a process control of uniform PI coating and film thickness, and with a space for precision coating for PI is getting smaller. An overlap between the PI area and a sealing layer will affect adhesion between the sealing layer and the GOA devices. The greater the overlapping area between the PI area and the sealing layer, adhesion of PI to the sealing layer is easily poor if the display panels are bent.

Therefore, reducing the overlapping area between the PI area and the sealing layer to improve quality of the display panels is an urgent technical problem that needs to be solved by those skilled in the art.

Technical problem: an embodiment of the present disclosure provides a display panel and a display device, which can improve sealing of an insulating film and quality of the display panel.

SUMMARY OF THE INVENTION

An embodiment of the present disclosure provides a display panel which comprises:
  a driver circuit layer having a first surface and a second surface disposed opposite to the first surface;
  a metal layer disposed on the first surface and provided with gaps;
  an insulating layer disposed on one surface of the metal layer away from the driver circuit layer and embedded into the gaps;
  a plastic layer disposed on one surface of the insulating layer away from the driver circuit layer;
  a sealing layer covering a surface of the plastic layer away from the driver circuit layer;
  a retaining wall extending from the first surface to the sealing layer and disposed on a middle position of the driver circuit layer; and
  an insulating film disposed between the plastic layer and the sealing layer and on one side of the retaining wall.

In some embodiments, the retaining wall is wavy, continuously convex, or jagged.

In some embodiments, the retaining wall is disposed in one of the gaps.

In some embodiments, a width of the retaining wall ranges from 20 μm to 40 μm.

In some embodiments, the retaining wall is formed by a halftone mask.

In some embodiments, a height of the retaining wall ranges from 1.0 μm to 2.5 μm.

In some embodiments, the display panel further comprises a transparent conductive film disposed on one surface of the sealing layer away from the driver circuit layer.

In some embodiments, the driver circuit layer comprises a ring-shaped area and a busline area disposed adjacent, and the retaining wall is disposed in the busline area.

In some embodiments, the plastic layer is a copolymer plastic of heptafluoropropyl trifluorovinyl ether and polytetrafluoroethene.

In some embodiments, the insulating film is a polyimide film.

An embodiment of the present disclosure further provides a display device comprising a display panel, wherein the display panel comprises:
  a driver circuit layer having a first surface and a second surface disposed opposite to the first surface;
  a metal layer disposed on the first surface and provided with gaps;
  an insulating layer disposed on one surface of the metal layer away from the driver circuit layer and embedded into the gaps;
  a plastic layer disposed on one surface of the insulating layer away from the driver circuit layer;
  a sealing layer covering a surface of the plastic layer away from the driver circuit layer;
  a retaining wall extending from the first surface to the sealing layer and disposed on a middle position of the driver circuit layer; and
  an insulating film disposed between the plastic layer and the sealing layer and on one side of the retaining wall.

In some embodiments, the retaining wall is wavy, continuously convex, or jagged.

In some embodiments, the retaining wall is disposed in one of the gaps.

In some embodiments, a width of the retaining wall ranges from 20 μm to 40 μm.

In some embodiments, the retaining wall is formed by a halftone mask.

In some embodiments, a height of the retaining wall ranges from 1.0 μm to 2.5 μm.

In some embodiments, the display panel further comprises a transparent conductive film disposed on one surface of the sealing layer away from the driver circuit layer.

In some embodiments, the driver circuit layer comprises a ring-shaped area and a busline area disposed adjacent, and the retaining wall is disposed in the busline area.

In some embodiments, the plastic layer is a copolymer plastic of heptafluoropropyl trifluorovinyl ether and polytetrafluoroethene.

In some embodiments, the insulating film is a polyimide film.

Beneficial effect: the display panel and the display device provided by embodiments of the present disclosure include a driver circuit layer, a metal layer, an insulating layer, a plastic layer, a sealing layer, a retaining wall, and an insulating film. The driver circuit layer has a first surface and a second surface disposed opposite to the first surface, the metal layer is disposed on the first surface and is provided with gaps, the insulating layer is disposed on one surface of the metal layer away from the driver circuit layer and is embedded into the gaps, the plastic layer is disposed on one surface of the insulating layer away from the driver circuit layer, the sealing layer covers a surface of the plastic layer away from the driver circuit layer, the retaining wall extends from the first surface to the sealing layer and is disposed on a middle position of the driver circuit layer, and the insulating film is disposed between the plastic layer and the sealing layer and on one side of the retaining wall. The present disclosure disposes the retaining wall on the middle position of the driver circuit layer, the retaining wall can prevent the insulating film from overlapping the whole sealing layer in the insulating film coating process, which improves adhesion of the display panel and reliability against high temperature and high humidity, thereby improving quality of the display panel.

BRIEF DESCRIPTION OF THE SEVERAL VIEWS OF THE DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

DESCRIPTION OF SPECIFIC EMBODIMENTS OF THE INVENTION

Figure 1:
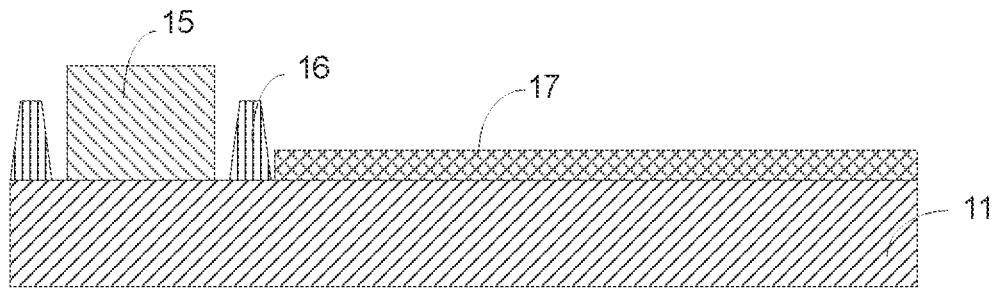
FIG. 1 is a schematic structural diagram of a display panel according to a related embodiment.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

It should be noted that in the description of the present disclosure, it should be understood that terms such as "upper", "lower", "front", "rear", "left", "right", "inside", "outside", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure.

Figure 2:
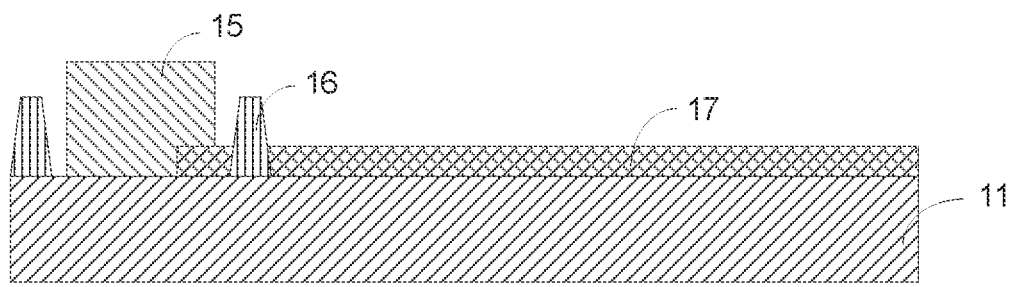
FIG. 2 is a schematic structural diagram of another display panel according to a related embodiment.

According to background technology, we can know that different overlapping degrees between an insulating film and a sealing layer have differences on cell processing limitations and quality of products. In related embodiments, a structural panel with an insulating film and a sealing layer not overlapped is provided. Referring to FIG. 1 for details, the insulating film 17 in the structural panel has a small coating area, which has good adhesion. In addition, another structural panel with an insulating film 17 and a sealing layer 15 partially overlapped is provided. Referring to FIG. 2 for details, the insulating film 17 in the structural panel has a medium coating area, which has normal adhesion.

Embodiments of the present disclosure provide a display panel and a display device. The following describes the display panel in detail.

Figure 3:
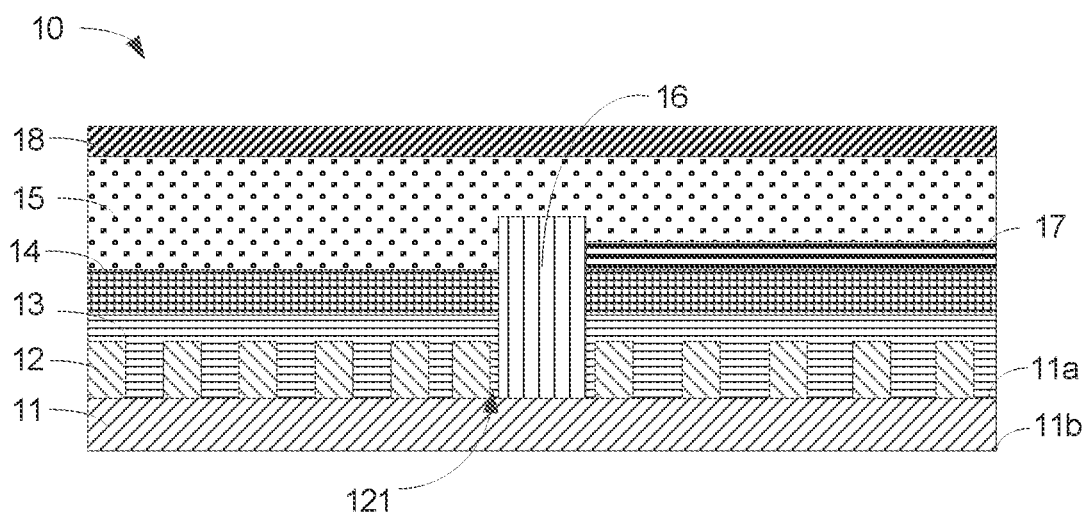
FIG. 3 is a schematic structural diagram of a display panel according to an embodiment of the present disclosure.

Referring to FIG. 3, FIG. 3 is a schematic structural diagram of a display panel according to an embodiment of the present disclosure. Wherein, A display panel 10 includes a driver circuit layer 11, a metal layer 12, an insulating layer 13, a plastic layer 14, the sealing layer 15, a retaining wall 16, and the insulating film 17. The driver circuit layer 11 has a first surface 11a and a second surface 11b disposed opposite to the first surface 11a, the metal layer 12 is disposed on the first surface 11a and is provided with gaps 121, the insulating layer 13 is disposed on one surface of the metal layer 12 away from the driver circuit layer 11 and is embedded into the gaps 121, the plastic layer 14 is disposed on one surface of the insulating layer 13 away from the driver circuit layer 11, the sealing layer 15 covers a surface of the plastic layer 14 away from the driver circuit layer 11, the retaining wall 16 extends from the first surface 11a to the sealing layer 15 and is disposed on a middle position of the driver circuit layer 11, and the insulating film 17 is disposed between the plastic layer 14 and the sealing layer 15 and on one side of the retaining wall 16.

It should be noted that the first surface 11a of the driver circuit layer 11 is an upper surface, and the second surface 11b of the driver circuit layer 11 is a lower surface. Of course, in some embodiments, positions of the first surface 11a and the second surface 11b can be exchanged.

In addition, the metal layer 12 includes a gate electrode metal layer 12. The metal layer 12 is provided with gaps 121. In the embodiment of the present disclosure, the metal layer 12 is not described in detail.

In addition, the insulating layer 13 is formed on the metal layer 12 by depositing, and a material for the insulating layer 13 may be SiNx/SiOx. Of course, the insulating layer 13 may use other materials, which is not described in detail in the embodiment of the present disclosure.

In addition, the plastic layer 14 is a polymer type plastic, such as a copolymer plastic of heptafluoropropyl trifluorovinyl ether and polytetrafluoroethene. The plastic layer 14 may also be other types of plastics, which is not described in detail herein.

In addition, the sealing layer 15 may use a sealant. In the embodiment of the present disclosure, a material for the sealant is not specifically limited.

Furthermore, the insulating film 17 is a polyimide film, and other materials may also be used as the insulating film 17, which is not described in detail in the embodiment of the present disclosure.

Figure 4:
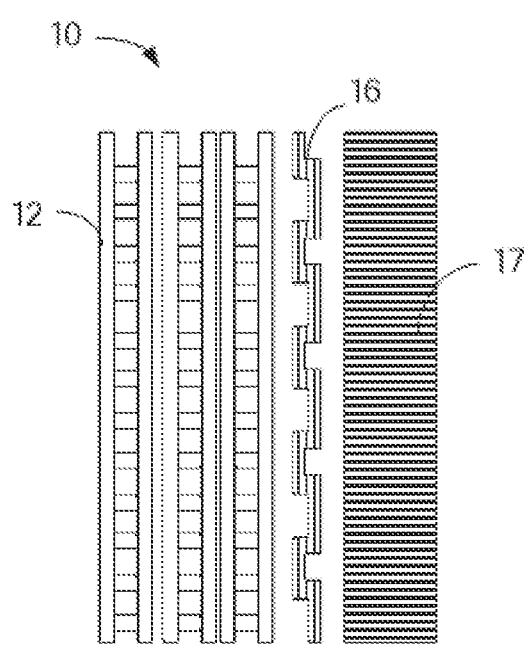
FIG. 4 is a schematic top view of a display panel according to an embodiment of the present disclosure.

Referring to FIG. 4, FIG. 4 is a schematic top view of a display panel according to an embodiment of the present disclosure. Wherein, the retaining wall 16 is wavy, continuously convex, or jagged. The retaining wall in the embodiment of the present disclosure uses this structure can relieve an influence of coated terrain for the sealing layer 15, thereby reducing the influence of coated terrain and preventing the sealing layer 15 from being broken.

Wherein, the retaining wall 16 is disposed in one of the gaps 121. It can be understood that when disposing the retaining wall 16, it is more convenient to dispose the retaining wall 16 in the gap 121 of the metal layer 12, and the retaining wall 16 will not affect the metal layer 12.

Wherein, a width of the retaining wall 16 ranges from 20 µm to 40 µm. It can be understood that the width of the retaining wall 16 may be 20 µm, 25 µm, 30 µm, 35 µm, 40 µm, etc. In the embodiment of the present disclosure, the width of the retaining wall 16 set within the range can not only block the insulating film 17 from covering the whole sealing layer 15, but also block water vapor from entering a display area.

Wherein, the retaining wall 16 is formed by a halftone mask. The retaining wall 16 is formed by the halftone mask, which can form the retaining wall 16 rapidly, reduce manufacturing processes, and improve production efficiency.

Wherein, a height of the retaining wall 16 ranges from 1.0 µm to 2.5 µm. It can be understood that the height of the retaining wall 16 may be 1 µm, 1.5 µm, 2 µm, 2.5 µm, etc. In the embodiment of the present disclosure, the height of the retaining wall 16 set within the range can not only block the insulating film 17 from covering the whole sealing layer 15, but also block the water vapor from entering the display area.

Wherein, the display panel 10 further includes a transparent conductive film 18 disposed on one surface of the sealing layer 15 away from the driver circuit layer 11.

Figure 5:
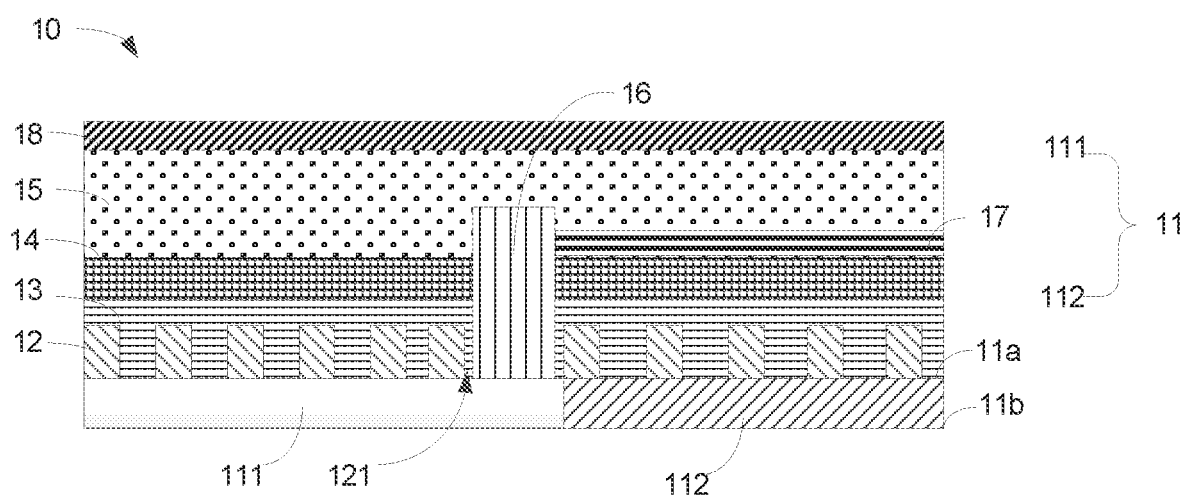
FIG. 5 is another schematic structural diagram of a display panel according to an embodiment of the present disclosure.

Referring to FIG. 5, FIG. 5 is a schematic structural diagram of another display panel according to an embodiment of the present disclosure. Wherein, the driver circuit layer 11 comprises a ring-shaped area 112 and a busline area 111 disposed adjacent, and the retaining wall 16 is disposed in the busline area 111.

In some embodiments, the insulating film 17 is disposed in the ring-shaped area 112.

The display panel 10 provided by the embodiment of the present disclosure includes a driver circuit layer 11, a metal layer 12, an insulating layer 13, a plastic layer 14, a sealing layer 15, a retaining wall 16, and an insulating film 17. The driver circuit layer 11 has a first surface 11a and a second surface 11b disposed opposite to the first surface 11a, the metal layer 12 is disposed on the first surface 11a and is provided with gaps 121, the insulating layer 13 is disposed on one surface of the metal layer 12 away from the driver circuit layer 11 and is embedded into the gaps 121, the plastic layer 14 is disposed on one surface of the insulating layer 13 away from the driver circuit layer 11, the sealing layer 15 covers a surface of the plastic layer 14 away from the driver circuit layer 11, the retaining wall 16 extends from the first surface 11a to the sealing layer 15 and is disposed on a middle position of the driver circuit layer 11, and the insulating film 17 is disposed between the plastic layer 14 and the sealing layer 15 and on one side of the retaining wall 16. The present disclosure disposes the retaining wall 16 on the middle position of the driver circuit layer 11, the retaining wall 16 can prevent the insulating film 17 from overlapping the whole sealing layer 15 in the insulating film 17 coating process, which improves adhesion of the display panel 10 and reliability against high temperature and high humidity, thereby improving quality of the display panel 10.

Figure 6:
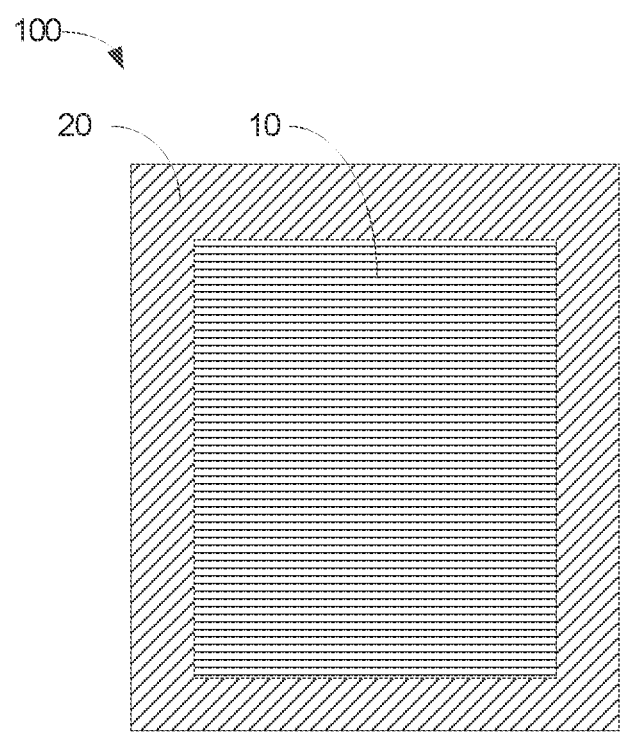
FIG. 6 is a schematic structural diagram of a display device according to an embodiment of the present disclosure.

Referring to FIG. 6, FIG. 6 is a schematic structural diagram of a display device according to an embodiment of the present disclosure.

Wherein, the display device 100 includes the above display panel 10 and a frame 20. The frame 20 is disposed surrounding the display panel 10. The above embodiments of the present disclosure have described the display panel 10 in detail, so the embodiment does not repeat to describe the display panel 10 herein. Since the display panel 10 in the above embodiment is used in the embodiment of the present disclosure, all beneficial effects of the display panel 10 in the above embodiment are also inherited.

The display panel and the display device provided by the embodiment of the present disclosure are described in detail above. The specific examples are applied in the description to explain the principle and implementation of the disclosure. The description of the above embodiments is only for helping to understand the technical solution of the present disclosure and its core ideas. Meanwhile, for those skilled in the art, the range of specific implementation and application may be changed according to the ideas of the present disclosure. In summary, the content of the specification should not be construed as causing limitations to the present disclosure.

What is claimed is:

1. A display panel, comprising:
   a driver circuit layer having a first surface and a second surface disposed opposite to the first surface;
   a metal layer disposed on the first surface and provided with gaps;
   an insulating layer disposed on one surface of the metal layer away from the driver circuit layer and embedded into the gaps;
   a plastic layer disposed on one surface of the insulating layer away from the driver circuit layer;
   a sealing layer covering a surface of the plastic layer away from the driver circuit layer;
   a retaining wall extending from the first surface to the sealing layer and disposed on a middle position of the driver circuit layer, wherein the retaining wall is disposed in one of the gaps; and
   an insulating film disposed between the plastic layer and the sealing layer and on one side of the retaining wall.

2. The display panel according to claim 1, wherein the retaining wall is wavy, continuously convex, or jagged.

3. The display panel according to claim 1, wherein a width of the retaining wall ranges from 20 µm to 40 µm.

4. The display panel according to claim 1, wherein the retaining wall is formed by a halftone mask.

5. The display panel according to claim 1, wherein a height of the retaining wall ranges from 1.0 µm to 2.5 µm.

6. The display panel according to claim 1, further comprising a transparent conductive film disposed on one surface of the sealing layer away from the driver circuit layer.

7. The display panel according to claim 1, wherein the driver circuit layer comprises a ring-shaped area and a busline area disposed adjacent, and the retaining wall is disposed in the busline area.

8. The display panel according to claim 1, wherein the plastic layer is a copolymer plastic of heptafluoropropyl trifluorovinyl ether and polytetrafluoroethene.

9. The display panel according to claim 1, wherein the insulating film is a polyimide film.

10. A display device comprising a display panel, wherein the display panel comprises:
    a driver circuit layer having a first surface and a second surface disposed opposite to the first surface;
    a metal layer disposed on the first surface and provided with gaps;
    an insulating layer disposed on one surface of the metal layer away from the driver circuit layer and embedded into the gaps;

a plastic layer disposed on one surface of the insulating layer away from the driver circuit layer;

a sealing layer covering a surface of the plastic layer away from the driver circuit layer;

a retaining wall extending from the first surface to the sealing layer and disposed on a middle position of the driver circuit layer, wherein the retaining wall is disposed in one of the gaps; and an insulating film disposed between the plastic layer and the sealing layer and on one side of the retaining wall.

11. The display device according to claim 10, wherein the retaining wall is wavy, continuously convex, or jagged.

12. The display device according to claim 10, wherein a width of the retaining wall ranges from 20 μm to 40 μm.

13. The display device according to claim 10, wherein the retaining wall is formed by a halftone mask.

14. The display device according to claim 10, wherein a height of the retaining wall ranges from 1.0 μm to 2.5 μm.

15. The display device according to claim 10, further comprising a transparent conductive film disposed on one surface of the sealing layer away from the driver circuit layer.

16. The display device according to claim 10, wherein the driver circuit layer comprises a ring-shaped area and a busline area disposed adjacent, and the retaining wall is disposed in the busline area.

17. The display device according to claim 10, wherein the plastic layer is a copolymer plastic of heptafluoropropyl trifluorovinyl ether and polytetrafluoroethene.

18. The display device according to claim 10, wherein the insulating film is a polyimide film.

\* \* \* \* \*